(12) United States Patent
Zhu et al.

(10) Patent No.: US 6,239,608 B1
(45) Date of Patent: *May 29, 2001

(54) METHOD FOR ANALYZING SCHOTTKY JUNCTION METHOD FOR EVALUATING SEMICONDUCTOR WAFER METHOD FOR EVALUATING INSULATING FILM AND SCHOTTKY JUNCTION ANALYZING APPARATUS

(75) Inventors: Yu Zhu, Soraku-gun; Yoshiteru Ishimaru, Tenri; Masafumi Shimizu, Kitakatsuragi-gun, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/330,457

(22) Filed: Jun. 11, 1999

Related U.S. Application Data

(62) Division of application No. 08/893,044, filed on Jul. 15, 1997.

(30) Foreign Application Priority Data

Aug. 6, 1996 (JP) ................................................ 8-207469
Feb. 20, 1997 (JP) ................................................ 9-036773

(51) Int. Cl.$^7$ .................................................... G01R 31/26
(52) U.S. Cl. .......................................... 324/767; 324/765
(58) Field of Search ................................... 324/767, 766, 324/765, 719, 716; 438/14, 17, 18, 572, 580, 22; 257/40, 48

(56) References Cited

U.S. PATENT DOCUMENTS

| | | | |
|---|---|---|---|
| 4,509,012 | * 4/1985 | Lin | 324/767 |
| 4,675,601 | * 6/1987 | Zoutendyk et al. | 324/767 |
| 5,516,725 | * 5/1996 | Chang et al. | 438/572 |
| 5,650,337 | * 7/1997 | Cahen et al. | 438/22 |
| 5,821,766 | * 10/1998 | Kim et al. | 324/769 |
| 5,942,909 | * 8/1999 | Zhu et al. | 324/767 |

FOREIGN PATENT DOCUMENTS 60207345   10/1985   (JP).

OTHER PUBLICATIONS

Physics of Semiconductor Devices, $2^{nd}$ edition; S.M. Sze: 1981 Chp 5.4, pp. 254–259; John Wiley & Sons, Inc. Printed in United States, No Month Available.

(List continued on next page.)

Primary Examiner—Ernest Karlsen
Assistant Examiner—Minh Tang
(74) Attorney, Agent, or Firm—Dike, Bronstein, Roberts & Cushman, LLP; David G. Conlin; David A. Tucker

(57) ABSTRACT

A method for analyzing a Schottky junction of the present invention includes the step of obtaining electrical field dependence of the Schottky barrier height which shows a degree of dependence of the Schottky barrier height of the Schottky junction formed on a semiconductor wafer on an electrical field applied to an interface of the Schottky junction in a case where a reverse bias is applied to the Schottky junction. The method includes the steps of: applying the reverse bias of a plurality of voltage values to the Schottky junction; measuring a plurality of current values of a current flowing through the Schottky junction and a plurality of capacitance values of the Schottky junction, corresponding to the reverse bias of the plurality of voltage values; obtaining current-voltage characteristics and capacitance-voltage characteristics of the Schottky junction based on the plurality of current values and the plurality of capacitance values; calculating depletion layer charge-voltage characteristics showing a correlation between an accumulated charge in a depletion layer and a voltage by integrating the capacitance-voltage characteristics with respect to a voltage; and obtaining the electrical field dependence of the Schottky barrier height based on the current-voltage characteristics and the depletion layer charge-voltage characteristics.

4 Claims, 14 Drawing Sheets

OTHER PUBLICATIONS

Control of Schottky Barrier Height Using Highly Doped Surface Layers; J.M. Shannon.: Solid–State Electronics, 1976 vol. 19, No. 6–H, pp. 537–543; Pergamon Press. Printed in Great Britain, No Month Available.

Barrier height lowering of Schottky contacts on AlInAs layers grown by metal–organic chemical–vapor deposition, Shinobu Fujuita, et al.: J. Appl. Phys. 73:3, Feb. 1, 1993; pp. 1284–1287.

The role of the metal–semiconductor interface in silicon integrated circuit technology, J. M. Andrews: J. Vac. Sci. Technol., 11: 6, Nov./Dec. 1974; pp. 974–984.

Effect of termionic–field emission on effective barrier height lowering in $In_{0.52}Al_{0.48}As$ Schottky Diodes; Unemoto, et al.: Appl Phys. Lett. 62:16, Apr. 19, 1993; pp. 1964–1966.

* cited by examiner

METHOD FOR ANALYZING SCHOTTKY JUNCTION METHOD FOR EVALUATING SEMICONDUCTOR WAFER METHOD FOR EVALUATING INSULATING FILM AND SCHOTTKY JUNCTION ANALYZING APPARATUS

This application is a Division of 08/893,044, filed Jul. 15, 1997.

BACKGROUND OF THE INVENTION

1. Field of the Invention

The present invention relates to a method for analyzing a unction, a method for evaluating a semiconductor wafer, a method for evaluating an insulating film, and a Schottky junction analyzing apparatus. In particular, the present invention relates to an improved method for obtaining the electrical field dependence of the Schottky barrier height (which shows the degree of dependence of barrier height in a Schottky junction on an electrical field applied to a Schottky barrier interface).

2. Description of the Related Art

In evaluating semiconductor crystal forming a semiconductor wafer and evaluating the characteristics of a semiconductor device having a Schottky junction it is, very important to measure the barrier height in a Schottky junction formed at an interface between a semiconductor region and a Schottky electrode. As is disclosed in Japanese Laid-Open Patent Publication No. 60-207345 (Reference 1), a method for evaluating a Schottky barrier by measuring the current-voltage (I-V) or capacitance-voltage (C-V) characteristics of a Schottky junction have been widely used in the past.

In general, the I-V characteristics of a Schottky junction are given by the following Expressions (1) and (2), as is disclosed in *Physics of Semiconductor Devices*, 1981, John Wiley & Sons (Reference 2).

$$J = J_s \{exp(qV/kT) - 1\} \quad (1)$$

$$J_s = AT^2 exp(-q\Phi_b/kT) \quad (2)$$

where J is the current flowing through a Schottky junction, $J_s$ the saturated current density, $\Phi_b$ the Schottky barrier height, q the electronic charge, V the voltage applied to the Schottky junction, k the Boltzmann's constant, T the absolute temperature (°K), and A the effective Richardson constant.

According to Expression (1), when a forward bias voltage is applied to the Schottky junction, the current J flowing through the Schottky junction exponentially increases. On the other hand, when a reverse bias voltage is applied to the Schottky junction, the current J flowing through the Schottky junction is saturated at $-J_s$.

It is common knowledge that a reverse direction current (hereinafter, referred to as a leak current) in a Schottky junction remarkably increases with the increase in a reverse bias voltage. In other words, the decrease in an effective barrier is observed. This corresponds to the Schottky barrier height $\Phi_b$ in Expression (2) varying with a reverse bias V.

Such an effective barrier lowering phenomenon is caused by a tunneling current passing through a barrier and an insulating film interposed between a Schottky electrode and a semiconductor.

First, the decrease in an effective barrier caused by a tunneling current will be described. As a leak current flowing through a Schottky junction, there is a thermionic emission current which goes over a Schottky barrier and a tunneling current which passes through the Schottky barrier. As disclosed in *Solid State Electronics*, June, 1976, Vol. 19, No. 6, pp. 537–543 (Reference 3), as an electrical field applied to an interface of a Schottky junction increases, the Schottky barrier height becomes lower. As a result, a tunneling current increases, and an effective barrier decreases.

Next, the decrease in an effective barrier caused by an insulating film will be described. As is disclosed in *J. Appl. Phys.* February, 1993, Vol. 73, No. 3, pp. 1284–1287 (Reference 4), in the case where an insulating film interposed between a Schottky electrode and a semiconductor region is thin, a barrier of the insulating film itself is negligible, and a Schottky barrier depends upon a reverse bias applied to the Schottky electrode on the insulating film. More specifically, as the reverse bias applied to the Schottky electrode increases, an electrical field generated at a Schottky junction interface increases and a Schottky barrier decreases.

As is disclosed in *J. Vac. Sci. Technol.*, November, 1974, Vol. 11, No. 6, pp. 972–984 (Reference 5) and the above-mentioned Reference 3, the electrical field dependence of the Schottky barrier height controlled by the tunneling current and the thickness of an insulating film (i.e., the dependence of the Schottky barrier height on an electrical field strength at an interface of a Schottky junction) can be represented by the following Expression (3) with respect to the tunneling current and the insulating film.

$$\Phi_b = \Phi_{b0} - \alpha E \quad (3)$$

where E is the electrical field strength at a Schottky junction interface, $\Phi_{b0}$ the Schottky barrier height at E=0, and a the proportionality factor. As the tunneling current increases and/or as the insulating film (interposed between the Schottky electrode and the semiconductor region) at a Schottky junction interface becomes thicker, the proportionality factor α increases.

Thus, in evaluating a Schottky junction, particular, analyzing a leak current in a Schottky junction, it is required to measure the electrical field dependence of the Schottky barrier height (i.e., the proportionality factor α which determines the electrical field dependence of the Schottky barrier height).

However, it is difficult to directly measure the electrical field strength E at an interface in the above-mentioned Expression (3). Therefore, the electrical field strength at an interface is calculated by using an analytical expression (Expression (4)) of the voltage dependence of electrical field strength at an interface, whereby the proportionality factor α is extracted. The barrier height $\Phi_{b0}$ (E=0) in Expression (3) can be easily obtained from the C-V characteristics with respect to the Schottky junction. The barrier height $\Phi_b$ in Expression (3) can be relatively easily obtained from the I-V characteristics and the current-temperature characteristics with respect to the Schottky junction.

More specifically, as disclosed in Reference 2, in the case where the thickness of a Schottky contact layer (i.e., a semiconductor region) is larger than that of a depletion layer, the electrical field strength at an interface of a Schottky junction can be represented by the following Expression (4).

$$E = \sqrt{2qN_d/\epsilon(V_{bi} - V - kT/q)} \quad (4)$$

where $V_{bi}$ is the built-in voltage, $N_d$ is the donor impurity density of a Schottky contact layer, and $\epsilon$ is the semiconductor permittivity.

As is disclosed in *Appl. Phys. Lett.*, April, 1993 Vol. 62, No. 16, pp. 1964–1966 (Reference 6), the electrical field strength at an interface of a Schottky junction can be calculated from a voltage applied to the Schottky junction by using Expression (4), and the electrical field dependence of the Schottky barrier height (i.e., proportionality factor α) can be extracted by substituting the electrical field strength into Expression (3) together with the barrier height $\Phi_b$ and $\Phi_{b0}$.

However, according to the above-mentioned method for obtaining the electrical field dependence of the Schottky barrier height, in order to calculate the electrical field strength at an interface of a Schottky junction from a bias voltage applied to the Schottky junction, Expression (4) (i.e., an analytical expression which represents the voltage dependence of the electrical field strength at an interface) is used. Therefore, values of parameters of the build-in voltage $V_{bi}$ and the donor impurity density of a Schottky contact layer are required. There is a possibility that the reliability of the calculated result decreases due to errors in measurement of the parameters.

Furthermore, in the case where the thickness of a Schottky contact layer is smaller than that of a depletion layer, the above-mentioned Expression (4) does not hold. Therefore, it is required to find an analytical expression which holds for this structure.

In a semiconductor wafer, having a multilayer-epi structure in which a plurality of epitaxial layers are formed, included in a high electron mobility transistor, the distribution of electrons in a depletion layer is complicated, making it difficult to derive a precise analytical expression representing the voltage dependence of electrical field strength at an interface. Thus, it was not possible to extract the electrical field dependence of the Schottky barrier height in such a device structure.

SUMMARY OF THE INVENTION

A method for analyzing a Schottky junction of the present invention includes the step of obtaining electrical field dependence of the Schottky barrier height which shows a degree of dependence of the Schottky barrier height of the Schottky junction formed on a semiconductor wafer on an electrical field applied to an interface of the Schottky junction in a case where a reverse bias is applied to the Schottky junction. The method includes the steps of: applying the reverse bias of a plurality of voltage values to the Schottky junction; measuring a plurality of current values of a current flowing through the Schottky junction and a plurality of capacitance values of the Schottky junction, corresponding to the reverse bias of the plurality of voltage values; obtaining current-voltage characteristics and capacitance-voltage characteristics of the Schottky junction based on the plurality of current values and the plurality of capacitance values; calculating depletion layer charge-voltage characteristics showing a correlation between an accumulated charge in a depletion layer and a voltage by integrating the capacitance-voltage characteristics with respect to a voltage; and obtaining the electrical field dependence of the Schottky barrier height based on the current-voltage characteristics and the depletion layer charge-voltage characteristics.

Alternatively, a method for analyzing a Schottky junction of the present invention includes the step of obtaining electrical field dependence of the Schottky barrier height which shows a degree of dependence of the Schottky barrier height of the Schottky junction formed on a semiconductor wafer on an electrical field applied to an interface of the Schottky junction in a case where a reverse bias is applied to the Schottky junction. The method includes the steps of: applying the reverse bias of a plurality of voltage values to the Schottky junction; measuring a plurality of current values of a current flowing through the Schottky junction and a plurality of capacitance values of the Schottky junction, corresponding to the reverse bias of the plurality of voltage values; obtaining current-voltage characteristics and capacitance-voltage characteristics of the Schottky junction based on the plurality of current values and the plurality of capacitance values; calculating conductance-voltage characteristics showing a correlation between a conductance and a voltage of the Schottky junction by differentiating the current-voltage characteristics with respect to a voltage; and obtaining the electrical field dependence of the Schottky barrier height based on the capacitance-voltage characteristics and the conductance-voltage characteristics.

Alternatively, a method for analyzing a Schottky junction of the present invention includes the step of obtaining electrical field dependence of the barrier height which shows a degree of dependence of the Schottky barrier height of the Schottky junction formed on a semiconductor wafer on an electrical field applied to an interface of the Schottky junction in a case where a reverse bias is applied to the Schottky junction. The method includes the steps of: applying the reverse bias of a plurality of voltage values to the Schottky junction; measuring a plurality of conductance values of the Schottky junction and a plurality of capacitance values of the Schottky junction, corresponding to the reverse bias of the plurality of voltage values; obtaining conductance-voltage characteristics and capacitance-voltage characteristics of the Schottky junction based on the plurality of conductance values and the plurality of capacitance values; and obtaining the electrical field dependence of the Schottky barrier height based on the conductance-voltage characteristics and the capacitance-voltage characteristics.

According to another aspect of the present invention, a method for evaluating a semiconductor wafer includes the steps of: forming a Schottky junction on the semiconductor wafer; and obtaining electrical field dependence of the Schottky barrier height of the Shottky junction, using the above-mentioned method for analyzing a Schottky junction, wherein a semiconductor crystal forming the semiconductor wafer is evaluated based on the electrical field dependence of the Schottky barrier height.

According to another aspect of the present invention, a method for evaluating an insulating film includes the steps of: forming the insulating film on a semiconductor wafer; forming a Schottky electrode on the insulating film, a Schottky junction being formed on a portion opposing the Schottky electrode of the semiconductor wafer; and obtaining electrical field dependence of the Schottky barrier height of the Shottky junction, using the above-mentioned method for analyzing a Schottky junction, wherein characteristics of the insulating film including a semiconductor permittivity and a thickness are evaluated based on the electrical field dependence of the Schottky barrier height.

According to another aspect of the present invention, a method for analyzing a Schottky junction formed on a semiconductor wafer includes the steps of: applying a reverse bias of a plurality of voltage values to the Schottky junction; measuring a plurality of current values of a current flowing through the Schottky junction, corresponding to the reverse bias of the plurality voltage values; obtaining current-voltage characteristics of the Schottky junction based on the plurality of current values; calculating conductance-voltage characteristics showing a correlation between a conductance and a voltage of the Schottky junction by differentiating the current-voltage characteristics with respect to a voltage; and obtaining capacitance-voltage characteristics of the Schottky junction based on the conductance-voltage characteristics and known electrical field dependence of the Schottky barrier height characteristics of the Schottky junction.

Alternatively, a method for analyzing a Schottky junction formed on a semiconductor wafer of the present invention includes the steps of: applying a reverse bias of a plurality of voltage values to the Schottky junction; measuring a plurality of capacitance values of the Schottky junction, corresponding to the reverse bias of the plurality of voltage values; obtaining capacitance-voltage characteristics of the Schottky junction based on the plurality of capacitance values; calculating depletion layer charge-voltage characteristics showing a correlation between an accumulated charge in a depletion layer and a voltage by integrating the capacitance-voltage characteristics with respect to a voltage; and obtaining current-voltage characteristics of the Schottky junction based on the depletion layer charge-voltage characteristics and known electrical field dependence of Schottky barrier height characteristics of the Schottky junction.

According to another aspect of the present invention, a Schottky junction analyzing apparatus includes: a bias applying unit applying a reverse bias to a Schottky junction formed on a semiconductor wafer; a current measuring instrument measuring a leak current flowing through the Schottky junction under an application of the reverse bias; a capacitance measuring instrument measuring a capacitance of the Schottky junction; a first function deriving unit which receives outputs from the bias applying unit and the current measuring instrument to obtain current-voltage characteristics showing a correlation between a voltage applied to the Schottky junction and a current flowing through the Schottky junction; a second function deriving unit which receives outputs from the bias applying unit and the capacitance measuring instrument to obtain capacitance-voltage characteristics showing a correlation between a voltage applied to the Schottky junction and a capacitance of the Schottky junction; and an arithmetic unit conducting at least one operation of integration integrating the capacitance-voltage characteristics with respect to a voltage and differentiation differentiating the current-voltage characteristics with respect to a voltage. Electrical field dependence of the Schottky barrier height which shows a degree of dependence of the Schottky barrier height of the Schottky junction on an electrical field applied to an interface of the Schottky junction is derived, based on the current-voltage characteristics and depletion layer charge-voltage characteristics showing a correlation between an accumulated charge in a depletion layer and a voltage stipulated by the integrated capacitance-voltage characteristics or based on the capacitance-voltage characteristics and conductance-voltage characteristics showing a correlation between a conductance and a voltage of the Schottky junction stipulated by the differentiated current-voltage characteristics.

Alternatively, a Schottky junction analyzing apparatus includes: a bias applying unit applying a reverse bias to a Schottky junction formed on a semiconductor wafer; a conductance measuring instrument measuring a conductance of the Schottky junction; a capacitance measuring instrument measuring a capacitance of the Schottky junction; a first function deriving unit which receives outputs from the bias applying unit and the conductance measuring instrument to obtain conductance-voltage characteristics showing a correlation between a voltage applied to the Schottky junction and the conductance of the Schottky junction; and a second function deriving unit which receives outputs from the bias applying unit and the capacitance measuring instrument to obtain capacitance-voltage characteristics showing a correlation between a voltage applied to the Schottky junction and a capacitance of the Schottky junction, wherein electrical field dependence of the Schottky barrier height which shows a degree of dependence of the Schottky barrier height of the Schottky junction on an electrical field applied to an interface of the Schottky junction is derived based on the conductance-voltage characteristics and the capacitance-voltage characteristics.

Hereinafter, the function of the present invention will be described.

According to the present invention, I-V and C-V characteristics are obtained with respect to a Schottky junction, and a C-V function stipulating the C-V characteristics is integrated with respect to a voltage, thereby calculating depletion layer charge-voltage characteristics stipulated by the integrated C-V function, showing a correlation between an accumulated charge in a depletion layer and a voltage. Thus, interface electrical field strength-voltage characteristics can be obtained from the depletion layer charge-voltage characteristics and a general relational expression showing an electrical field in terms of a charge and a permittivity. Because of this, the electrical field dependence of the Schottky barrier height can be obtained from a relational expression showing a relationship between the Schottky barrier height and the electrical field strength (i.e., the parameters in the relational expression can be obtained) without using an analytical expression representing the voltage dependence of the interface electrical field strength including parameters such as the built-in voltage $V_{bi}$ and the impurity density $N_d$ of a contact layer.

According to the present invention, the I-V and C-V characteristics are obtained with respect to the Schottky junction, and the I-V function stipulating the I-V characteristics are differentiated with respect to a voltage, thereby calculating conductance-voltage characteristics stipulated by the differentiated I-V function, showing a correlation between the conductance and the voltage of the Schottky junction. Because of this, the electrical field dependence of the Schottky barrier height can be obtained from a relational expression showing a relationship between the conductance and the capacitance of the Schottky junction based on the C-V characteristics and the conductance-voltage characteristics. Therefore, the electrical field dependence of the Schottky barrier height in the relational expression showing a relationship between the Schottky barrier height and the electrical field strength can be obtained (i.e., the parameters in the relational expression can be obtained) without using an analytical expression representing the voltage dependence of the interface electrical field strength including parameters such as the built-in voltage $V_{bi}$ and the impurity density $N_d$ of a contact layer.

According to the present invention, the conductance-voltage characteristics and C-V characteristics are obtained with respect to a Schottky junction. Therefore, the electrical field dependence of the Schottky barrier height in a relational expression showing a relationship between the Schottky barrier height and the electrical field strength can be obtained (i.e., the parameters in the relational expression can be obtained) without using an analytical expression representing the voltage dependence of the interface electrical field strength including parameters such as the built-in voltage $V_{bi}$ and the impurity density $N_d$ of a contact layer.

Furthermore, according to the present invention, the conductance-voltage characteristics are directly obtained.

Therefore, compared with the case where the I-V function stipulating the I-V characteristics is differentiated with respect to a voltage to calculate the conductance-voltage characteristics, a measurement error can be prevented from being amplified by differentiation and the data precision of the conductance-voltage characteristics can be prevented from decreasing.

According to the present invention, the electrical field dependence of the height of Schottky barrier formed on a semiconductor wafer are obtained by a method not using an analytical expression representing the voltage dependence of an interface electrical field strength. Therefore, the reliability of an evaluation result of a semiconductor wafer can be prevented from decreasing due to errors in measurement of the parameters such as the built-in voltage $V_{bi}$ and the impurity density $N_d$ of a contact layer included in the analytical expression.

An analytical expression representing the voltage dependence of an interface electrical field strength is not used for analyzing a Schottky junction so as to evaluate a semiconductor wafer. Therefore, even in a semiconductor wafer having a multilayer-epi-structure such as a high electron mobility transistor, from which it is difficult to derive a precise analytical expression representing the voltage dependence of an interface electrical field strength, the electrical field dependence of the Schottky barrier height is extracted and evaluated.

According to the present invention, the electrical field dependence of the height of Schottky barrier formed on a semiconductor wafer with an insulating film interposed therebetween can be obtained by a method not using an analytical expression representing the voltage dependence of an interface electrical field strength. Therefore, the reliability of an evaluation result of an insulating film on a semiconductor wafer can be prevented from decreasing due to the measurement error of the parameters such as the built-in voltage $V_{bi}$ and the impurity density $N_d$ of a contact layer.

An analytical expression representing the voltage dependence of an interface electrical field strength is not used for analyzing a Schottky junction so as to evaluate an insulating film on a semiconductor wafer. Therefore, even in an insulating film on a semiconductor wafer having a multilayer-epi-structure such as a high electron mobility transistor, from which it is difficult to derive a precise analytical expression representing the voltage dependence of an interface electrical field strength, the electrical field dependence of the Schottky barrier height is extracted and evaluated.

According to the present invention, a first function deriving unit which obtains an I-V function stipulating a correlation between a voltage applied to a Schottky junction and a current flowing through the Schottky junction as I-V characteristics, based on outputs from a bias applying unit and a current measuring instrument, and a second function deriving unit which receives outputs from the bias applying unit and the capacitance measuring instrument and obtains a C-V function stipulating a correlation between a voltage applied to the Schottky junction and a capacitance of the Schottky junction as C-V characteristics are provided. At least one operation of integration integrating the C-V function with respect to a voltage and differentiation differentiating the I-V function with respect to a voltage is conducted. Therefore, the interface electrical field strength-voltage characteristics are obtained from the depletion layer charge-voltage characteristics and a general relational expression representing an electrical field in terms of a charge and a semiconductor permittivity. The electrical field dependence of the Schottky barrier height included in a relational expression showing a correlation between a conductance and a capacitance of the Schottky junction can be obtained based on the C-V characteristics and the conductance-voltage characteristics. Therefore, the electrical field dependence of the Schottky barrier height in a relational expression showing a relationship between the Schottky barrier height and the electrical field strength can be obtained (i.e., the parameters of the relational expression can be obtained) without using an analytical expression representing the voltage dependence of an interface electrical field strength including the parameters such as the built-in voltage $V_{bi}$ and the impurity density $N_d$ of a contact layer.

According to the present invention, I-V characteristics are obtained with respect to a Schottky junction, and an I-V function stipulating the I-V characteristics is differentiated with respect to a voltage, thereby obtaining conductance-voltage characteristics showing a correlation between the conductance and the voltage of the Schottky junction. C-V characteristics are obtained with respect to the Schottky junction, based on conductance-voltage characteristics and known electrical field dependence of Schottky barrier height characteristics. More specifically, assuming that the electrical field dependence of Schottky barrier height characteristics have already been determined, the conductance-voltage characteristics are obtained by measurement and operation, and the C-V characteristics are obtained based on the conductance-voltage characteristics and the electrical filed dependence of Schottky barrier height characteristics.

According to the present invention, C-V characteristics are obtained with respect to a Schottky junction, and a C-V function stipulating the C-V characteristics is integrated with respect to a voltage, thereby obtaining depletion layer charge-voltage characteristics showing a correlation between an accumulated charge in a depletion layer and a voltage. I-V characteristics are obtained with respect to the Schottky junction, based on the depletion layer charge-voltage characteristics and known electrical field dependence of Schottky barrier height characteristics. Assuming that the electrical field dependence of Schottky barrier height characteristics have already been determined, depletion layer charge-voltage characteristics are obtained by measurement and operation, and the I-V characteristics are obtained based on the depletion layer charge-voltage characteristics and the electrical field dependence of Schottky barrier height characteristics.

Thus, the invention described herein makes possible the advantages of (1) providing a method for analyzing a Schottky junction which is capable of being used to analyze a Schottky junction even in a semiconductor wafer having a complicated semiconductor layer structure without requiring the extraction of values of parameters of the built-in voltage $V_{bi}$ and the donor impurity density $N_d$ of a Schottky contact layer; (2) providing a Schottky junction analyzing apparatus using the method for analyzing a Schottky junction; (3) providing a method for evaluating a semiconductor wafer using the method for analyzing a Schottky junction; and (4) providing a method for evaluating an insulating film.

These and other advantages of the present invention will become apparent to those skilled in the art upon reading and understanding the following detailed description with reference to the accompanying figures.

DESCRIPTION OF THE PREFERRED EMBODIMENTS

The basic principle of the present invention will be described.

A method for analyzing a Schottky junction was considered from a viewpoint different from those of a conventional evaluation method using I-V characteristics or a conventional evaluation method using C-V characteristics. As a result, the correlation between the I-V characteristics and the C-V characteristics of a Schottky junction was found for the first time. The Schottky junction is evaluated based on the correlation.

According to the method for evaluating a Schottky junction of the present invention, the I-V characteristics are combined with the C-V characteristics, whereby information can be obtained which cannot be obtained by the method for evaluating a Schottky junction using the I-V characteristics or the C-V characteristics alone.

Figure 1:
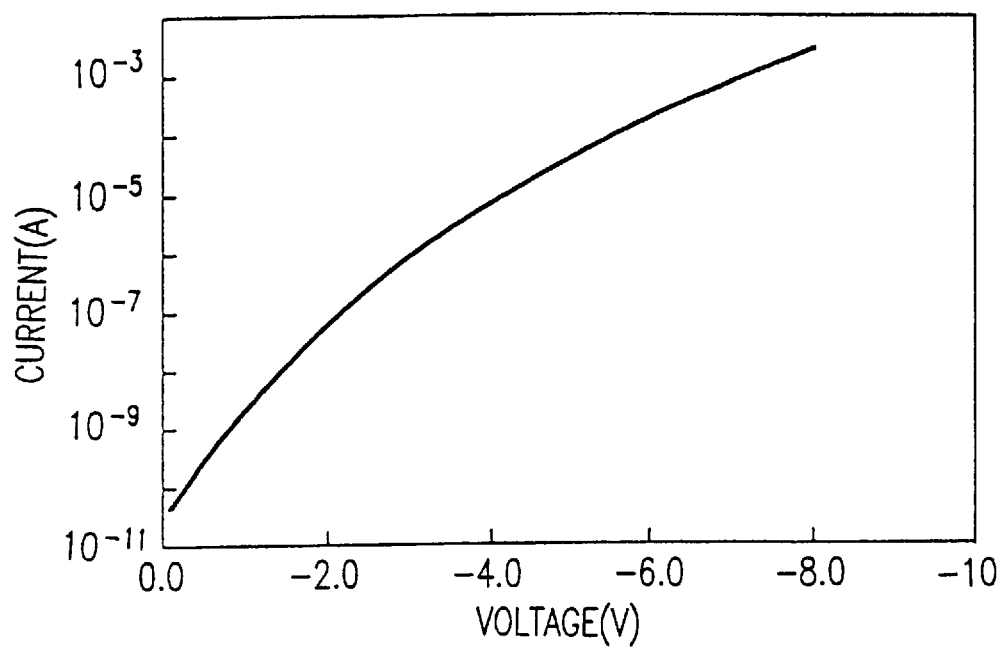
FIG. 1 is a graph showing I-V characteristics of a GaAs Schottky junction obtained by predetermined processes in methods for analyzing a Schottky junction of Embodiments 1 through 3 according to the present invention.
Figure 2:
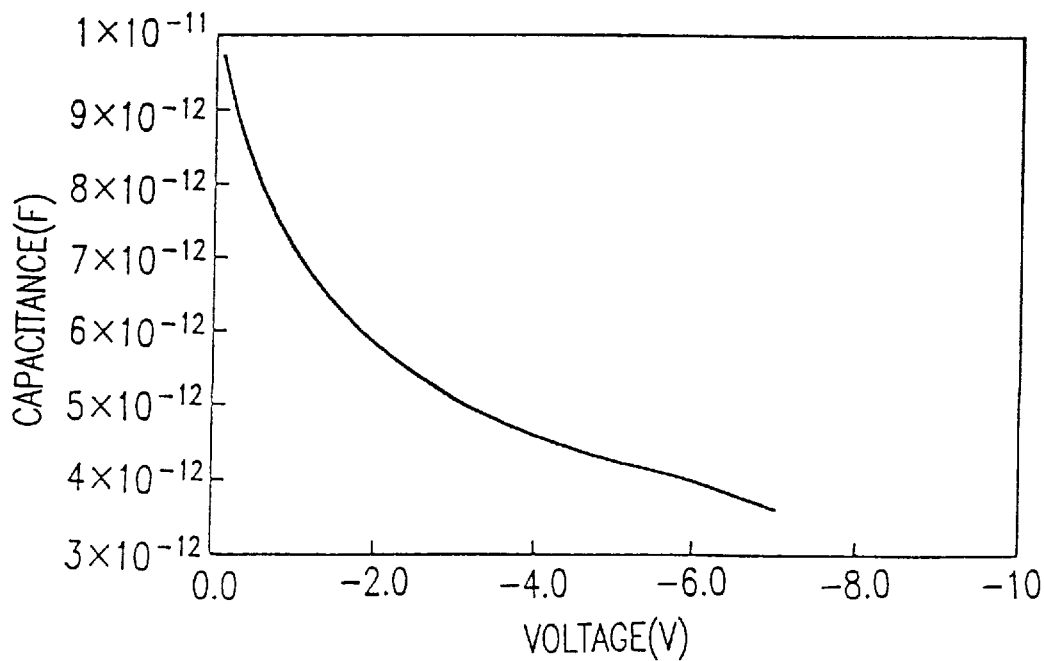
FIG. 2 is a graph showing C-V characteristics of a GaAs Schottky junction obtained by a predetermined process in the methods for analyzing a Schottky junction of Embodiments 1 through 3 according to the present invention.

Hereinafter, the principle of the present invention will be described in detail. There is a correlation between the I-V and C-V characteristics of a Schottky junction. FIGS. 1 and 2 are graphs showing I-V characteristics and C-V characteristics of a Schottky diode composed of an n-GaAs layer and a Schottky electrode including a Ti-layer, a Pt-layer, and an Au-layer formed on the n-GaAs layer.

Figure 3:
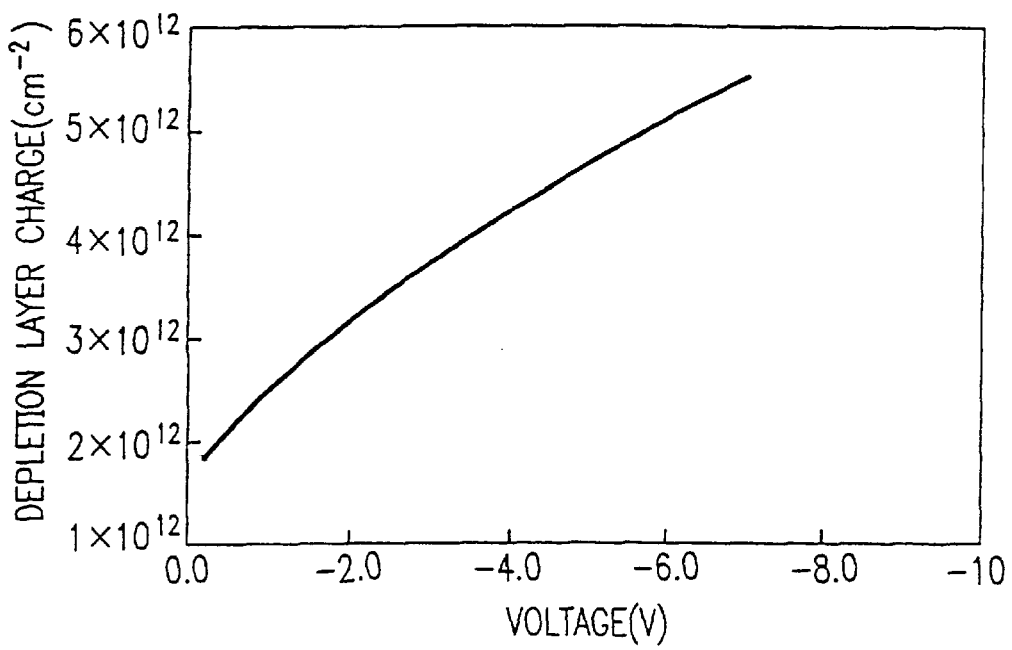
FIG. 3 is a graph showing depletion layer charge-voltage characteristics of a GaAs Schottky junction obtained by a predetermined process in the method for analyzing a Schottky junction of Embodiment 1 according to the present invention.

FIG. 3 is a graph showing the relationship between an accumulated charge in a depletion layer and a voltage (i.e., depletion layer sheet charge-voltage characteristics) obtained by integrating a C-V function stipulating C-V characteristics with respect to a voltage.

A correlation between the characteristics shown, in FIG. 1 and the characteristics shown in FIG. 2 is not clear. However, a correlation between the characteristics graph shown in FIG. 1 and the characteristics graph shown in FIG. 3 can be clearly found. This implies that there is a correlation between the I-V characteristics and the C-V characteristics.

This correlation was observed in any Schottky junction measured by the present inventors, regardless of the material of the electrode, the material of the semiconductor and the structure of the epitaxial layers. Examples of an electrode material which can be used herein include Al and Au. Examples of a semiconductor material which can be used herein include GaAs, AlGaAs, and InAlAs. Furthermore, examples of the epitaxial layer structure which can be used herein include a single layer structure and an HEMT structure.

Next, a logical ground for the correlation between the I-V characteristics and the C-V characteristics will be described.

The above-mentioned Expression (2) is modified with respect to $\Phi_b$ to obtain the following Expression (5).

$$\Phi_b = (kT/q)\ln(AT^2/J_s) \tag{5}$$

As is well known, a capacitance C is defined by a charge Q and a voltage V by the following Expression (6).

$$C = dQ/dV \tag{6}$$

Thus, assuming that the above-mentioned capacitance C is a capacitance of a Schottky junction, when the above-mentioned Expression (6) is integrated with respect to a voltage, the relationship between the accumulated charge Q in a depletion layer formed in a semiconductor region in the vicinity of a Schottky junction interface and the voltage V is obtained by the following Expression (7).

$$Q = \int C dV \quad (7)$$

In the case where the thickness of the depletion layer is sufficiently smaller than the size of the Schottky electrode, the electrical field strength E at an interface of the Schottky junction can be represented by the following Expression (8).

$$E = Q/\epsilon \quad (8)$$

where $\epsilon$ is the semiconductor permittivity.

As described above, the C-V function stipulating the C-V characteristics of a Schottky junction is integrated with respect to a voltage, thereby obtaining a function (Expression (7)) stipulating the depletion layer charge-voltage characteristics. Expression (7) is substituted into Expression (8) stipulating the relationship between the electrical field strength at an interface and the charge of a Schottky junction. Thus, Expression (9) stipulating the Schottky junction interface electrical field-voltage characteristics can be obtained.

$$E = \int C dV \cdot 1/\epsilon \quad (9)$$

As a result, the electrical field dependence of the Schottky barrier height (i.e., proportionality factor $\alpha$) can be obtained by substituting Expression (9) representing the electrical field of a Schottky junction-voltage characteristics into Expression (3) representing the relationship between the Schottky barrier height and the electrical field at a Schottky junction interface.

When Expression (5) is substituted into the left side of Expression (3), and Expressions (8) and (7) are substituted into the right side of Expression (3), Expression (10) is obtained.

$$ln(J_s) = ln(AT^2) - (q/kT)(\Phi_{b0} - \alpha \int C dV/\epsilon) \quad (10)$$

Expression (10) represents the correlation between the I-V characteristics and the C-V characteristics, specifying the electrical field dependence of the Schottky barrier height.

Furthermore, the electrical field dependence of the Schottky barrier height can be obtained by utilizing the correlation represented by Expression (10).

Hereinafter, the present invention will be described by way of illustrative embodiments.

Embodiment 1

Figure 4A:
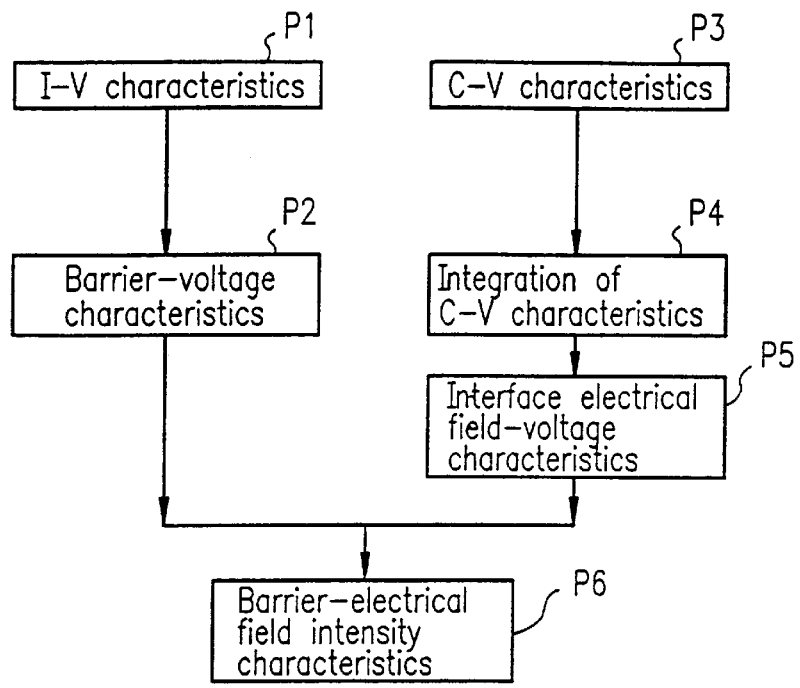
FIG. 4A is a flow chart showing processes in the method for analyzing a Schottky junction of Embodiment 1 according to the present invention.
Figure 4B:
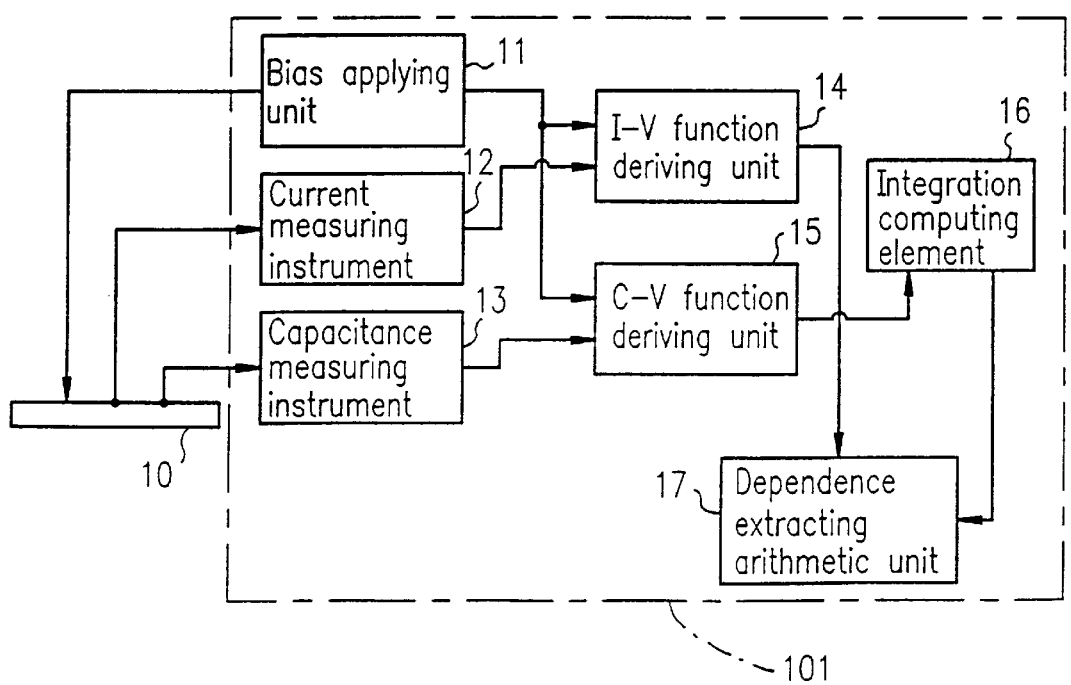
FIG. 4B is a block diagram showing a structure of a Schottky junction analyzing apparatus.

FIG. 4A is a flow chart showing processes in a method for analyzing a Schottky junction of Embodiment 1 according to the present invention. FIG. 4B is a block diagram showing a structure of a Schottky junction analyzing apparatus.

In these figures, a Schottky junction analyzing apparatus 101 includes a bias applying unit 11 applying a reverse bias to a Schottky junction formed on a semiconductor wafer 10, a current measuring instrument 12 measuring a leak current flowing through the Schottky junction under the application of a reverse bias, and a capacitance measuring instrument 13 measuring a capacitance of the Schottky junction. Here, it is intended that the Schottky junction is formed between an n-GaAs layer and a metal electrode composed of a Ti-layer, a Pt-layer, and an Au-layer.

The apparatus 101 further includes an I-V function deriving unit 14, a C-V function deriving unit 15, and an integration computing element 16. The I-V function deriving unit 14 receives outputs from the bias applying unit 11 and the current measuring instrument 12 to provide an I-V function, which stipulates the relationship between a voltage to be applied to the Schottky junction and a current flowing through the Schottky junction, as I-V characteristics. The C-V function deriving unit 15 receives outputs from the bias applying unit 11 and the capacitance measuring instrument 13 to obtain a C-V function, which stipulates the relationship between a voltage applied to the Schottky junction and a capacitance of the Schottky junction, as C-V characteristics. The integration computing element 16 integrates the C-V function with respect to a voltage.

The apparatus 101 is constructed in such a manner that a dependence extracting arithmetic unit 17 derives the electrical field dependence of the Schottky barrier height (i.e., the degree of dependence of the Schottky barrier height on an electrical field applied to an interface of the Schottky junction), based on the charge-voltage characteristics (i.e., the relationship between the accumulated charge in a depletion layer and the voltage) stipulated by the integrated C-V function and the I-V characteristics.

Next, a method for analyzing a Schottky junction will be described.

First, a reverse bias is applied to the Schottky junction on the semiconductor wafer 10 by the bias applying unit 11, and a value of the reverse bias is changed. A leak current and a junction capacitance corresponding to a value of each reverse bias are obtained by the current measuring instrument 12 and the capacitance measuring instrument 13.

Then, the I-V function is obtained as the I-V characteristics (see FIG. 1), based on the measured leak current and applied reverse bias, by the I-V function deriving unit 14 (Process P1). Using the above-mentioned Expression (2), barrier-voltage characteristics are obtained from the I-V characteristics (Process P2).

The C-V function is obtained as the C-V characteristics (see FIG. 2), based on the measured capacitance and applied reverse bias, by the C-V function deriving unit 15 (Process P3). Then, the C-V function is integrated with respect to a voltage to obtain a depletion layer charge-voltage characteristics (see FIG. 3) (Process P4). Then, using the above-mentioned Expressions (7) through (10), the interface electrical field strength-voltage characteristics are obtained from the depletion layer charge-voltage characteristics (Process P5).

Figure 5:
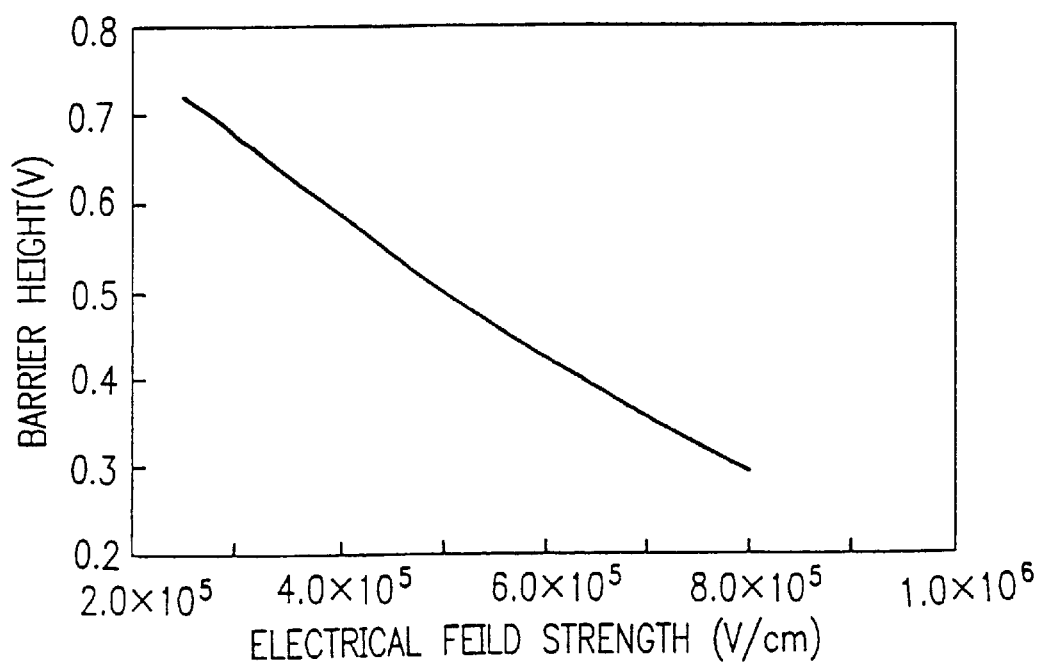
FIG. 5 is a graph showing barrier-electrical field characteristics of a GaAs Schottky junction obtained by the method for analyzing a Schottky junction of Embodiment 1 according to the present invention.

Barrier-electrical field strength characteristics are obtained from the barrier-voltage characteristics and the interface electrical field strength-voltage characteristics by the arithmetic unit 17. The barrier-electrical field strength characteristics are represented by a graph on a coordinate in which the abscissa axis shows electrical field strength and the ordinate axis shows barrier height. The slope and intercept with the ordinate axis are obtained from the graph shown in FIG. 5 (Process P6).

The slope and the intercept represent a proportionality factor $\alpha$ and barrier height $\Phi_{b0}$ (E=0) in Expression (3). From FIG. 5, $\alpha = 75$ Å is extracted, which is in agreement with the calculated result in the above-mentioned Reference 3.

Such an analysis of a Schottky junction is conducted with respect to a semiconductor wafer in which a Schottky junction is formed, whereby the crystallinity of a semiconductor forming the semiconductor wafer can be evaluated. This is because the electrical field dependence of the Schottky barrier height (i.e., proportionality factor $\alpha$ in Expression (3)) depends upon the crystallinity of the semiconductor.

Next, a method for analyzing a Schottky junction in an HEMT structure will be described.

Figure 6:
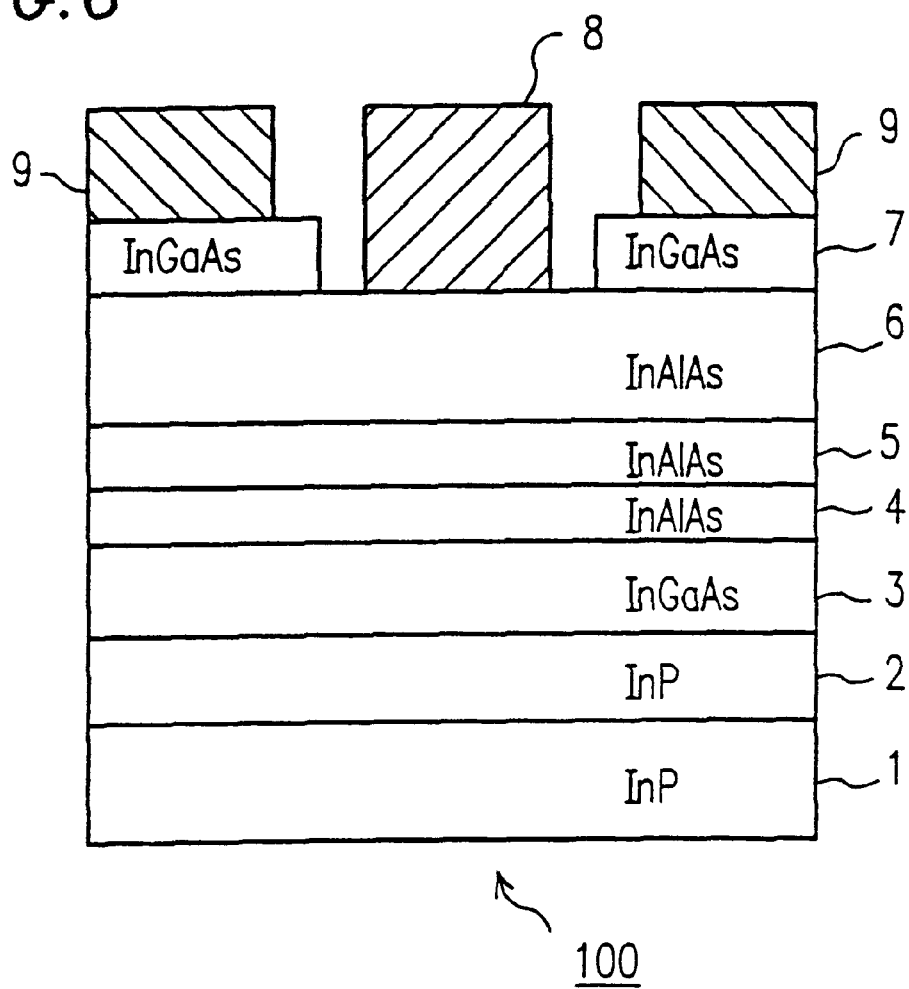
FIG. 6 is a cross-sectional view of an HEMT (high-electron-mobility transistor) structure composed of InAlAs/InGaAs/InP which is to be analyzed by the method for analyzing a Schottky junction of Embodiment 1 according to the present invention.

FIG. 6 shows an HEMT structure composed of epitaxially grown layers whose Schottky junction is to be analyzed.

An HEMT structure 100 having a Schottky junction includes: an undoped $In_{0.47}Ga_{0.53}As$ channel layer 3 (thickness: about 30 nm) formed on a semi-insulating InP substrate 1 with an InP buffer layer 2 (thickness: about 300 nm) interposed therebetween; an n-type $In_{0.52}Al_{0.48}As$ carrier supply layer 5 (thickness: about 3 nm) doped with Si in a concentration of $9 \times 10^{18}$ cm$^{-3}$ formed on the channel layer 3 with an undoped $In_{0.52}Al_{0.48}As$ spacer layer 4 (thickness: about 2 nm) interposed therebetween; and an undoped $In_{0.52}Al_{0.48}As$ Schottky contact layer 6 (thickness: about 17 nm) formed on the carrier supply layer 5. A Schottky electrode 8 made of Ti/Pt/Au is formed on a predetermined region on a surface of the Schottky contact layer 6, and Ohmic electrodes 9 made of AuGe/Ni/Au are formed on both sides of the Schottky electrode 8 on the surface of the Schottky contact layer 6 with n-type $In_{0.47}Ga_{0.53}As$ Ohmic contact layers 7 (thickness: 2 nm) doped with Si in a concentration of $5 \times 10^{18}$ cm$^{-3}$ interposed therebetween.

Figure 7:
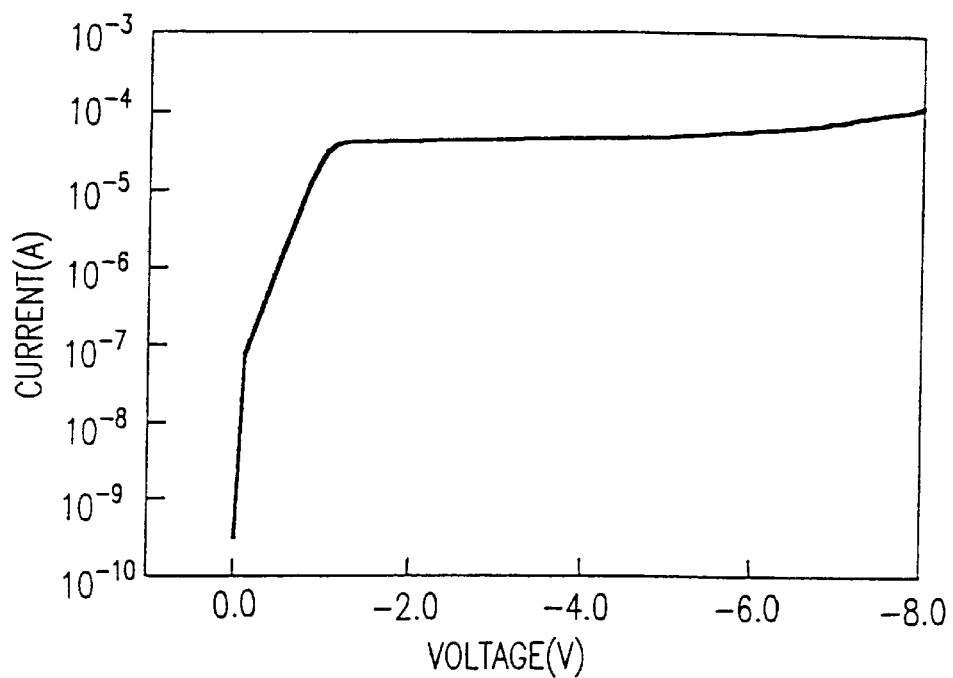
FIG. 7 is a graph showing I-V characteristics of a Schottky junction in the HEMT structure shown in FIG. 6.
Figure 8:
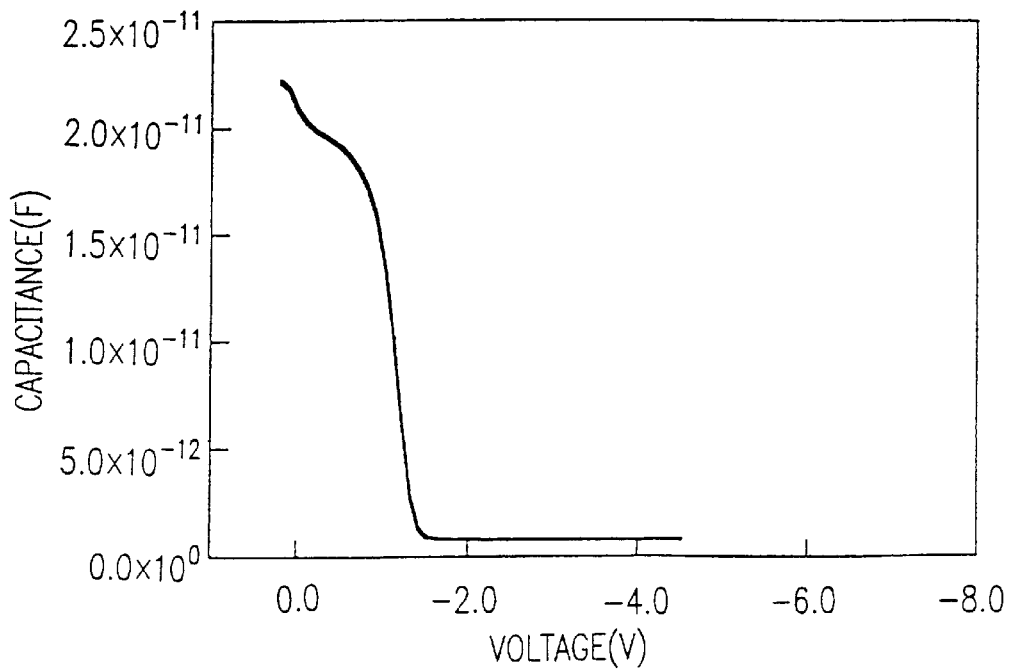
FIG. 8 is a graph showing C-V characteristics of a Schottky junction in the HEMT structure shown in FIG. 6.

Even in such an HEMT structure 100, the above-mentioned method for analyzing a Schottky junction of Embodiment 1 can be applied. The I-V characteristics (see FIG. 7) and the C-V characteristics (see FIG. 8) can be obtained with respect to the Schottky junction of the HEMT structure 100 by Processes P1 and P3 shown in FIG. 4A.

Figure 9:
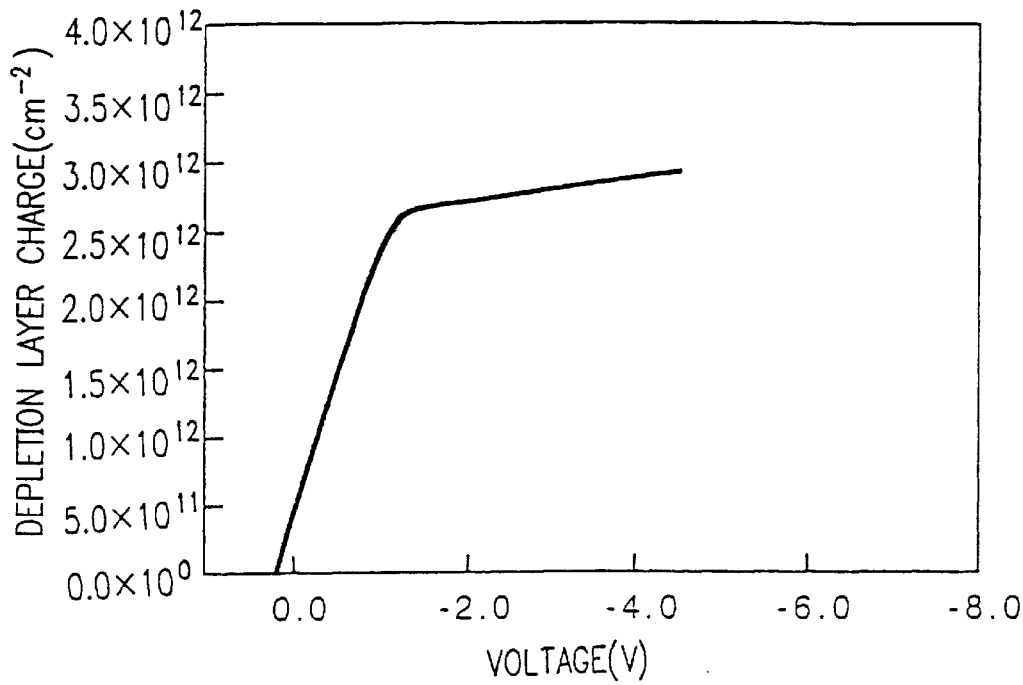
FIG. 9 is a graph showing depletion layer charge-voltage characteristics of a Schottky junction in the HEMT structure shown in FIG. 6.

Depletion layer charge-voltage characteristics (see FIG. 9) can be obtained by Process P4 shown in FIG. 4A by integrating the C-V characteristics with respect to a voltage. A clear correlation is found between the characteristics shown in FIG. 7 and those shown in FIG. 9.

Furthermore, the barrier-electrical field characteristics (see FIG. 10) can be obtained by the combination of the I-V characteristics and the depletion layer charge-voltage characteristics. More specifically, the barrier-voltage characteristics are obtained from the I-V characteristics by Process P2, the interface electrical field-voltage characteristics are obtained from the depletion layer charge-voltage characteristics by Process P5, and the barrier-electrical field characteristics are obtained from the barrier-voltage characteristics and the interface electrical field-voltage characteristics by Process P6 shown in FIG. 4A.

Figure 10:
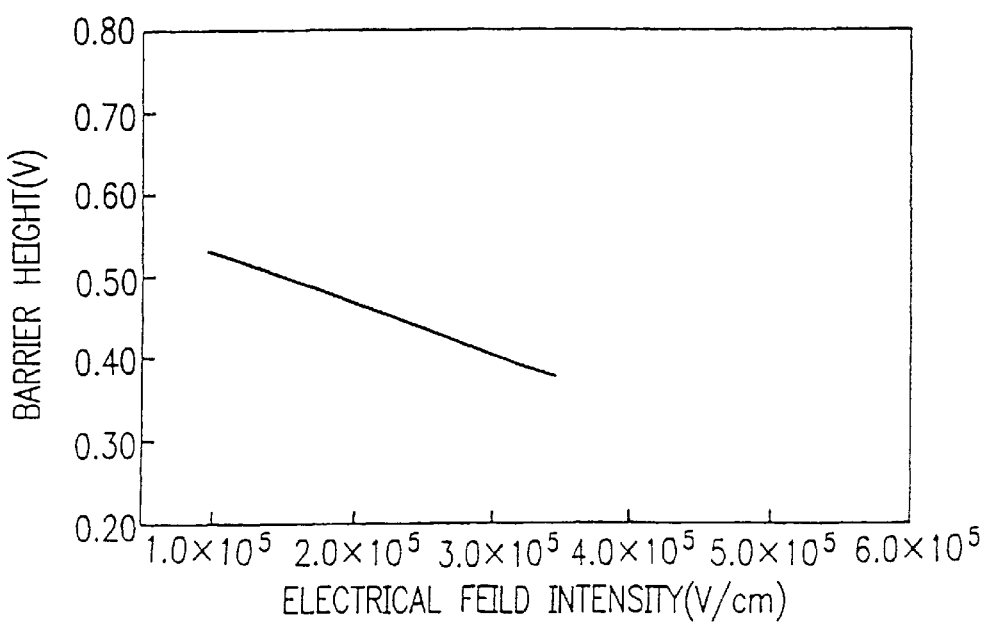
FIG. 10 is a graph showing barrier-electrical field characteristics of a Schottky junction in the HEMT structure shown in FIG. 6.

From the slope of the barrier-electrical field characteristics shown in FIG. 10, α=63 Å was obtained.

In such an HEMT structure 100, since a two-dimensional electron gas is present in the channel layer 3, the voltage dependence of the electrical field at the interface of the Schottky junction becomes complicated. Thus, the electrical field dependence of barrier height cannot be extracted by a conventional method. In contrast, according to the present invention, an analytical expression representing the voltage dependence of the electrical field as in the conventional analyzing method is not required for extracting the electrical field dependence of barrier height. Therefore, even in a semiconductor device having a complicated layered structure, the voltage dependence of the Schottky barrier height can be easily extracted only by obtaining the I-V characteristics and the C-V characteristics.

Hereinafter, the relationship between the voltage dependence of the Schottky barrier height and the damage to the surface of the Schottky contact layer caused by plasma will be briefly described.

The surface of the Schottky contact layer 6 of the device structure 100 shown in FIG. 6 is subjected to plasma treatment at 150° C. for 15 minutes under 0.5 Torr by a barrel oxygen plasma ashing system, before a gate electrode is formed thereon, whereby a region of the contact layer 6 in which a gate electrode is to be formed is damaged.

Thereafter, the gate electrode 8 (Schottky electrode) is formed on the surface of the contact layer 6 which has been subjected to plasma treatment. Furthermore, the HEMT structure 100 with a gate electrode formed thereon is placed in a nitrogen atmosphere and heat-treated for one minute. This heat treatment is conducted by setting the treatment temperature at 200° C., 250° C., 300° C., and 350° C., whereby 5 sample devices including a sample which has not been heat-treated are produced.

Each sample device is measured for I-V characteristics and C-V characteristics. The electrical field dependence of barrier height (i.e., the proportionality factor α in Expression (3)) is extracted by using the analyzing method of the present invention.

Figure 11:
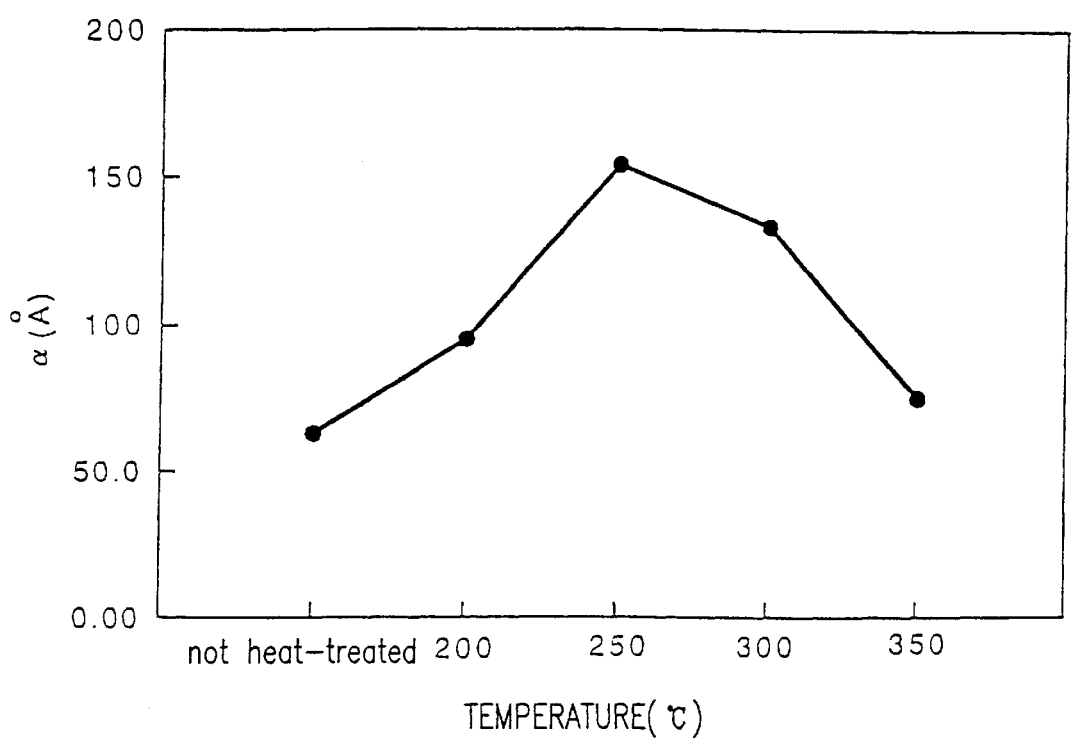
FIG. 11 is a graph showing the relationship between the electrical field dependence of the Schottky barrier height (proportionality factor α) in the HEMT structure shown in FIG. 6 and the heat treatment temperature after plasma treatment of a Schottky contact layer; i.e., a graph showing the temperature dependence of the proportionality factor α.

FIG. 11 shows the dependence of the extracted proportionality factor α on the treatment conditions. As shown in this figure, with sample devices having plasma damage, heat-treated at 200° C. and 250° C., the increase in proportionality factor α is observed. With sample devices having plasma damage, heat-treated at 300° C. and 350° C., the decrease in proportionality factor α is observed.

The dependence of the proportionality factor α on the treatment conditions shown in FIG. 11 can be described as follows.

Plasma damage is activated with heat treatment at 250° C. or lower, and deep levels are caused in the Schottky contact layer 6, whereby a tunneling current caused by these deep levels increases. This results in an increase in the proportionality factor α. On the other hand, remarkable recovery from plasma damage is possible with heat treatment at 300° C. or higher, whereby a tunneling current caused by these deep levels decreases. This results in a decrease in the proportionality factor α.

In Embodiment 1, the electrical field dependence of barrier height is extracted by the combination of the integrated C-V characteristics and I-V characteristics, in accordance with Expression (10). When both sides of Expression (10) are differentiated with respect to a voltage, the following Expression (11) is obtained.

$$(dJ_s/dv)J_s = q\alpha C/\epsilon kT \tag{11}$$

As is understood from the basic principle of the present invention utilizing the correlation between the I-V characteristics and the C-V characteristics, the electrical field dependence of barrier height can be extracted by the combination of the differentiated I-V characteristics and C-V characteristics.

Embodiment 2

A method for extracting the electrical field dependence of barrier height by the combination of the I-V characteristics and C-V characteristics will be described.

Figure 12A:
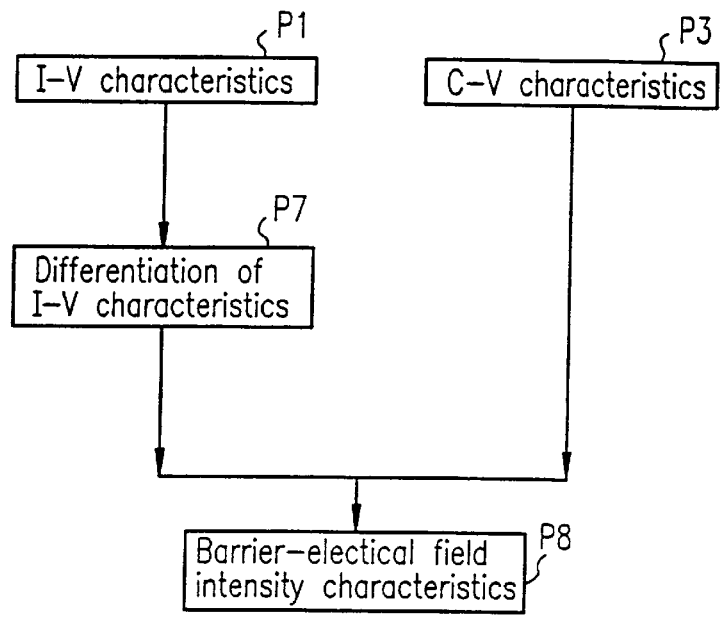
FIG. 12A is a flow chart showing processes in the method for analyzing a Schottky junction of Embodiment 2 according to the present invention.
Figure 12B:
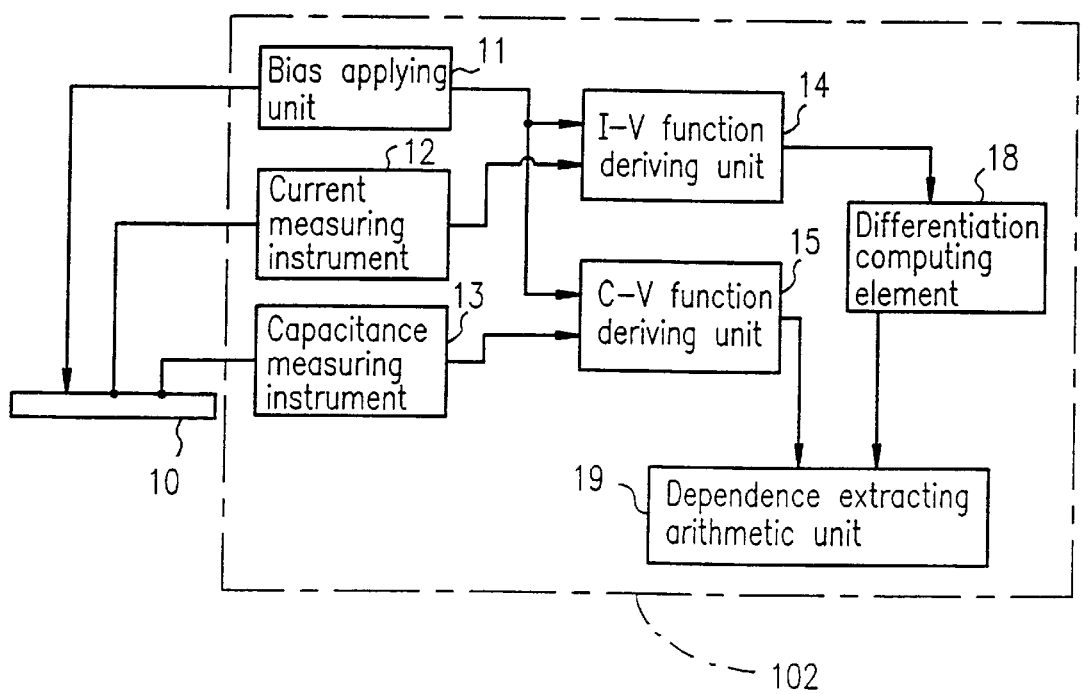
FIG. 12B is a block diagram showing a structure of a Schottky junction analyzing apparatus.

FIG. 12A is a flow chart showing processes in a method for analyzing a Schottky junction of Embodiment 2 according to the present invention. FIG. 12B is a block diagram showing a structure of a Schottky junction analyzing apparatus.

A Schottky junction analyzing apparatus 102 of Embodiment 2 includes a differentiation computing element 18 which differentiates the I-V function obtained by the I-V function deriving unit 14 with respect to a voltage, in place of the integration computing element 16 in the apparatus 101 of Embodiment 1. The apparatus 102 is constructed in such a manner that a dependence extracting arithmetic unit 19 derives the electrical field dependence of the Schottky barrier height, based on the conductance-voltage characteristics (i.e., the relationship between the conductance and the voltage of the Schottky junction) stipulated by the differentiated I-V function and the C-V characteristics. The other structure is identical with that of the apparatus 101 of Embodiment 1.

Next, a method for analyzing a Schottky junction will be described.

In the same way as in Embodiment 1, the I-V function is obtained as the I-V characteristics (see FIG. 1), based on the measured leak current and applied reverse bias, by the I-V function deriving unit 14 (Process P1), and the C-V function is obtained as the C-V characteristics (see FIG. 2), based on the measured capacitance and applied reverse bias, by the C-V function deriving unit 15 (Process P3).

The I-V function is differentiated with respect to a voltage to obtain the conductance-voltage characteristics (Process P7).

Then, the barrier-electrical field strength characteristics are obtained from the conductance-voltage characteristics and the C-V characteristics by the arithmetic unit 19 (Process P8).

The above-mentioned Expression (11) obtained by differentiating both sides of Expression (10) with respect to a voltage represents the relationship between the conductance of the Schottky junction and the capacitance of the Schottky junction in the form including the proportionality factor α. Therefore, the arithmetic unit 19 conducts an operation so as to obtain the proportionality factor α by using the combination of the conductance-voltage characteristics and the C-V characteristics in Expression (11). $dJ_s/dv$ in Expression (11) is the conductance of the Schottky junction.

In Embodiment 2, the conductance-voltage characteristics are obtained by differentiating the function representing the I-V characteristics with respect to a voltage. However, the conductance of the Schottky junction can be directly measured, and thus, the conductance-voltage characteristics can be obtained by measurement.

Embodiment 3

A method for analyzing a Schottky junction, obtaining conductance-voltage characteristics by measurement will be described.

Figure 13A:
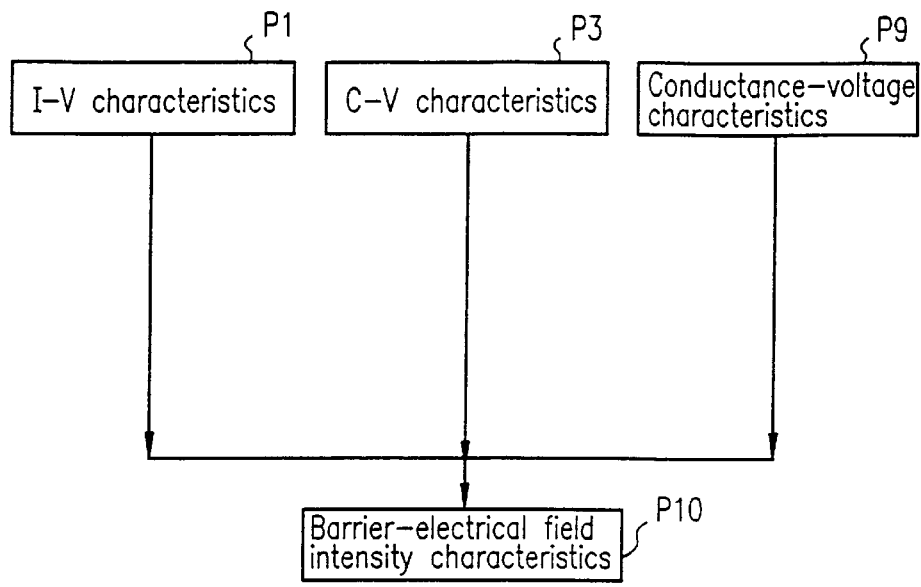
FIG. 13A is a flow chart showing processes in the method for analyzing a Schottky junction of Embodiment 3 according to the present invention.
Figure 13B:
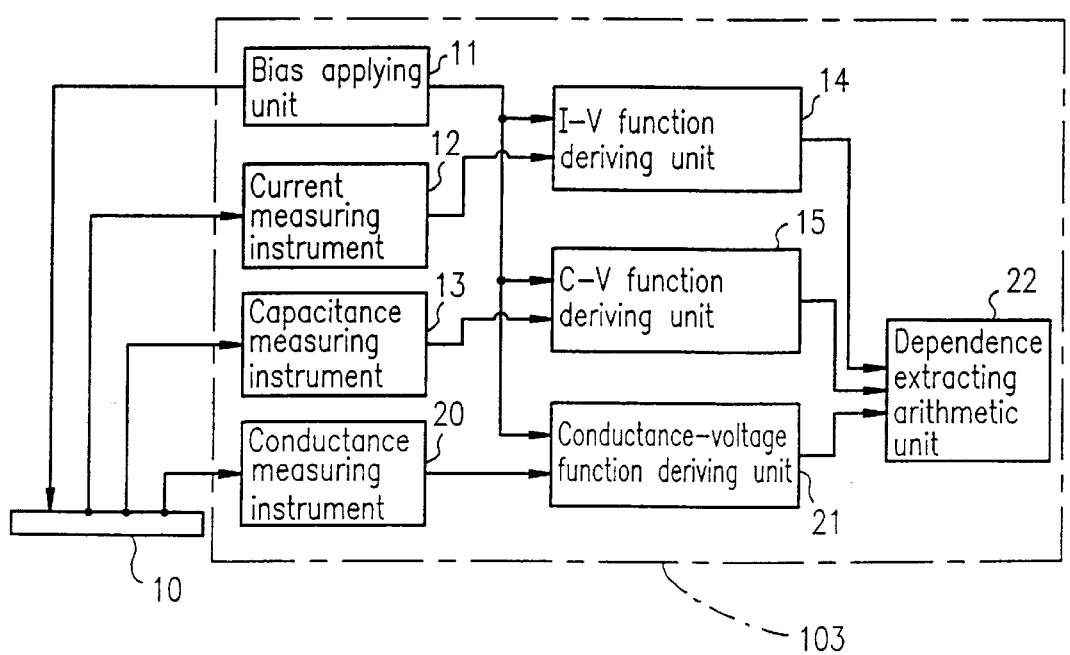
FIG. 13B is a block diagram showing a structure of a Schottky junction analyzing apparatus.

FIG. 13A is a flow chart showing processes in a method for analyzing a Schottky junction of Embodiment 3 according to the present invention. FIG. 13B is a block diagram showing a structure of a Schottky junction analyzing apparatus.

As shown in FIG. 13B, a Schottky junction analyzing apparatus 103 includes a conductance measuring instrument 20 and a conductance-voltage function deriving unit 21 in addition to the structure of the apparatus 102 of Embodiment 2. The conductance measuring instrument 20 measures a conductance of a Schottky junction. The conductance-voltage function deriving unit 21 receives outputs from the bias applying unit 11 and the conductance measuring instrument 20 to obtain a conductance-voltage function, which stipulates the relationship between a voltage applied to the Schottky junction and the conductance of the Schottky junction, as conductance-voltage characteristics.

The apparatus 103 is constructed in such a manner that a dependence extracting arithmetic unit 22 derives the electrical field dependence of the Schottky barrier height, based on the conductance-voltage characteristics, C-V characteristics, and I-V characteristics. The other structure is identical with that of the apparatus 102 of Embodiment 2.

Next, a method for analyzing a Schottky junction will be described.

In the same way as in Embodiment 2, the I-V function is obtained as the I-V characteristics (see FIG. 1), based on the measured leak current and applied reverse bias, by the I-V function deriving unit 14 (Process P1), and the C-V function is obtained as the C-V characteristics (see FIG. 2), based on the measured capacitance and applied reverse bias, by the C-V function deriving unit 15 (Process P3).

The conductance-voltage characteristics are obtained, based on the measured conductance and applied reverse bias, by the conductance-voltage function deriving unit 21 (Process P9).

Then, the barrier-electrical field strength characteristics are obtained from the conductance-voltage characteristics, the C-V characteristics, and the I-V characteristics by the dependence extracting arithmetic unit 22 (Process P10).

The dependence extracting arithmetic unit 22 conducts an operation so as to obtain the proportionality factor α by using the combination of the conductance-voltage characteristics obtained by measurement and the C-V characteristics with Expression (11) obtained by differentiating both sides of Expression (10) with respect to a voltage. In Expression (11), $dJ_s/dv$ is the conductance of the Schottky junction.

In Embodiment 3, unlike Embodiment 2, the conductance-voltage characteristics obtained by differentiating the I-V function are not used, and the conductance-voltage characteristics directly measured are used. Therefore, there is no possibility that the measurement error in the I-V characteristics is amplified by differentiating the I-V function stipulating the I-V characteristics to degrade data precision.

In Embodiment 3, the Schottky junction is analyzed by using the combination of the conductance-voltage characteristics obtained by measurement and the C-V characteristics in Expression (11). Therefore, it is not required to obtain the I-V characteristics in the methods described in the above-mentioned examples. However, it is effective to obtain the I-V characteristics for analyzing a Schottky junction for the following reason. It becomes possible to determine the measurement precision of the conductance-voltage characteristics obtained by measurement, based on the comparison between the I-V characteristics obtained by integrating the function stipulating the conductance-voltage characteristics and the I-V characteristics obtained by measurement.

Embodiment 4

Figure 14A:
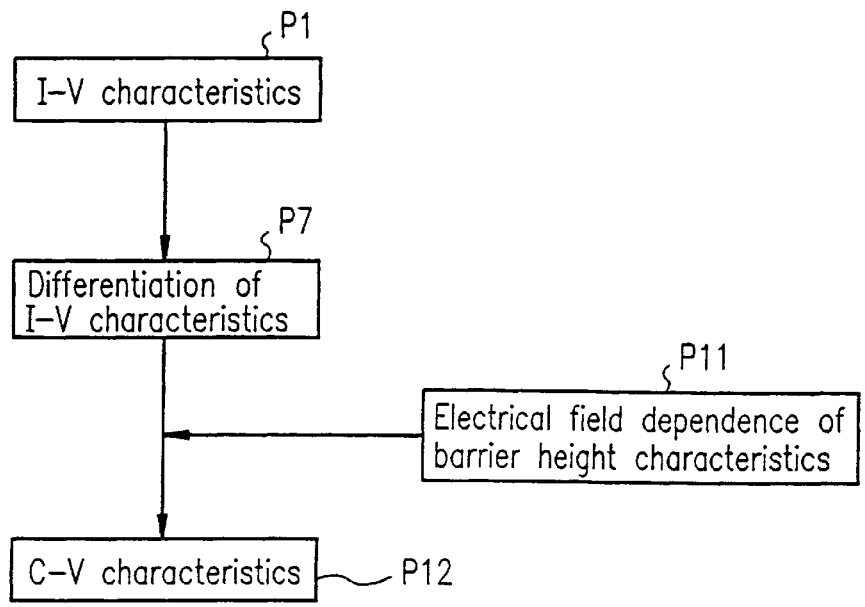
FIG. 14A is a flow chart showing processes in a method for analyzing a Schottky junction of Embodiment 4 according to the present invention.
Figure 14B:
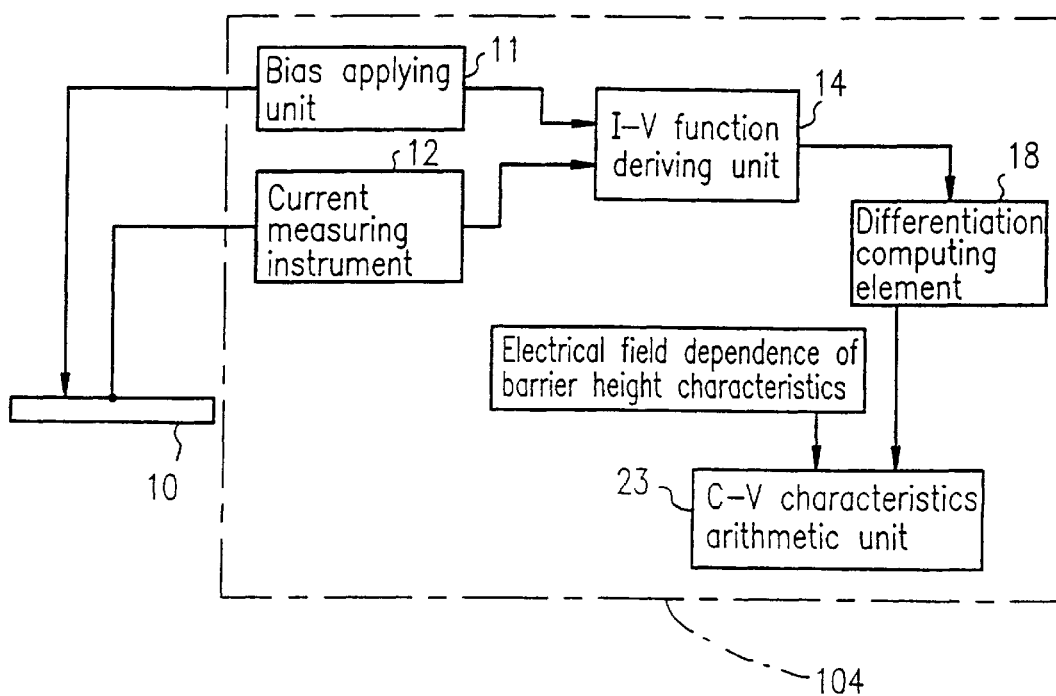
FIG. 14B is a block diagram showing a structure of a Schottky junction analyzing apparatus.

FIG. 14A is a flow chart showing processes in a method for analyzing a Schottky junction. FIG. 14B is a block diagram showing a structure of a Schottky junction analyzing apparatus.

In a Schottky junction analyzing apparatus 104 of Embodiment 4, the capacitance measuring instrument 13 and the C-V function deriving unit 15 in Embodiment 2 are omitted and a C-V characteristics arithmetic unit 23 is provided in place of the dependence extracting arithmetic unit 19. Unlike Embodiment 2, assuming that the electrical field dependence of Schottky barrier height characteristics has already been determined, the conductance-voltage characteristics of the Schottky junction are obtained in the methods described in the above-mentioned examples. Based on the conductance-voltage characteristics and the electrical field dependence of Schottky barrier height characteristics, C-V characteristics of the Schottky junction are obtained.

Next, a method for analyzing a Schottky junction will be described.

First, in the same way as in Embodiment 2, the I-V function is obtained as the I-V characteristics (see FIG. 1) (Process P1). The I-V characteristics are differentiated with respect to a voltage to obtain the conductance-voltage characteristics (Process P7).

Then, the C-V characteristics of the Schottky junction are obtained from the conductance-voltage characteristics and the known electrical field dependence of Schottky barrier height characteristics (Process P11) by the arithmetic unit 23 (Process P12).

More specifically, Expression (11) which represents the known electrical field dependence of Schottky barrier height characteristics shows the conductance-voltage characteristics and the C-V characteristics of the Schottky junction. Therefore, in the arithmetic unit 23, when the conductance-voltage characteristics are derived by measurement and operation, the C-V characteristics can be obtained only by operation.

Figure 15:
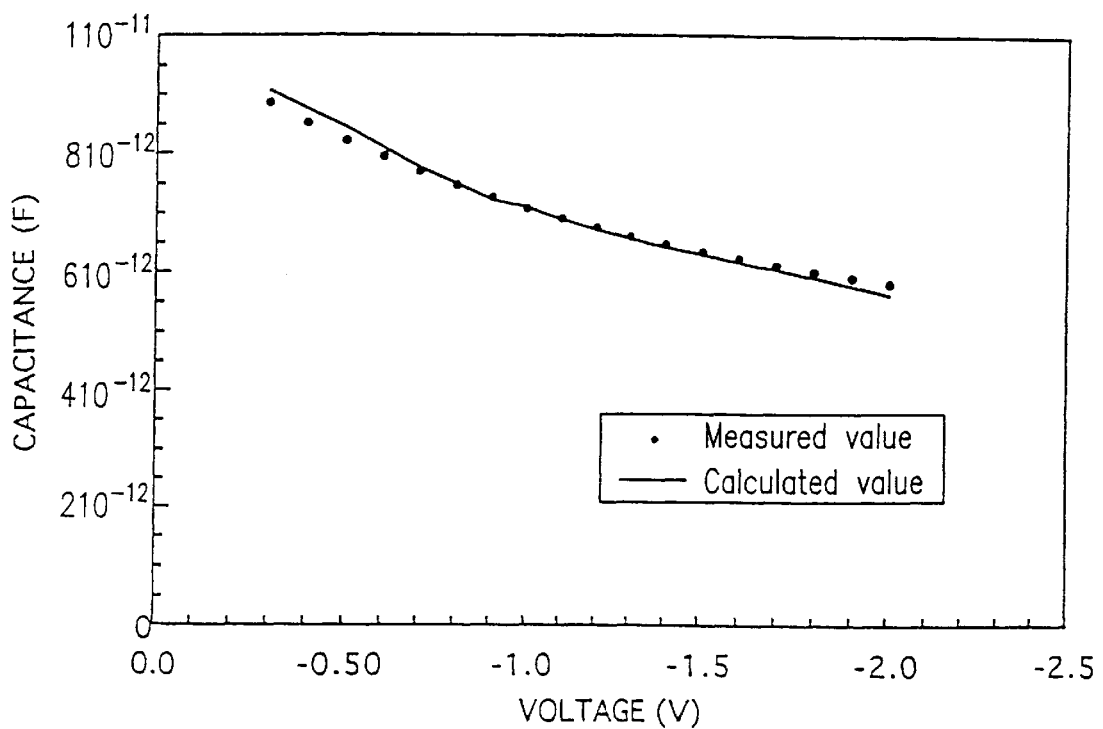
FIG. 15 is a graph showing C-V characteristics of a GaAs Schottky junction obtained by the method for analyzing a Schottky junction of Embodiment 4 according to the present invention and actually measured C-V characteristics of a GaAs Schottky junction.

A graph shown in FIG. 15 represents the C-V characteristics (calculated value) of a GaAs Schottky junction obtained by the method of Embodiment 4, and the actually measured C-V characteristics (measured value) of the GaAs Schottky junction. As is apparent from this graph, the calculated value is in agreement with the actually measured value.

Embodiment 5

Figure 16A:
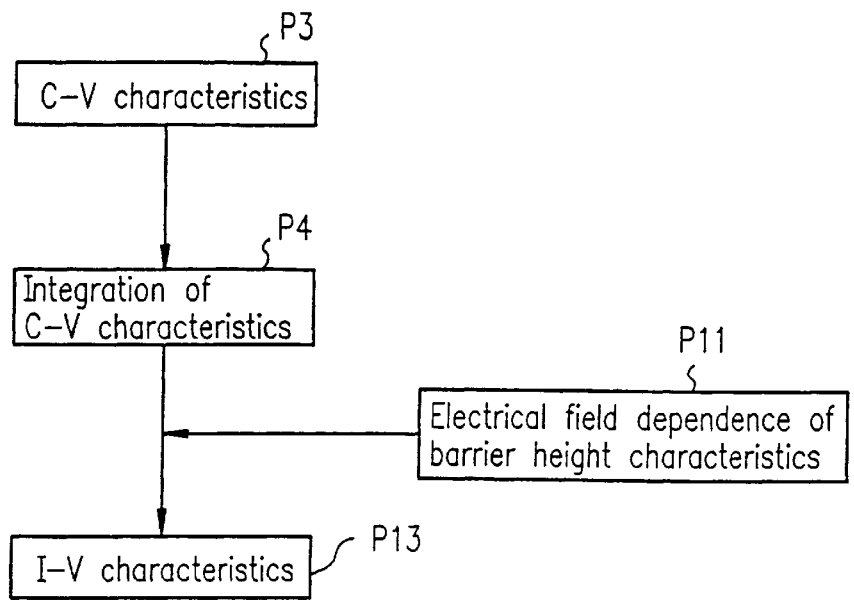
FIG. 16A is a flow chart showing processes in a method for analyzing a Schottky junction of Embodiment 5 according to the present invention.
Figure 16B:
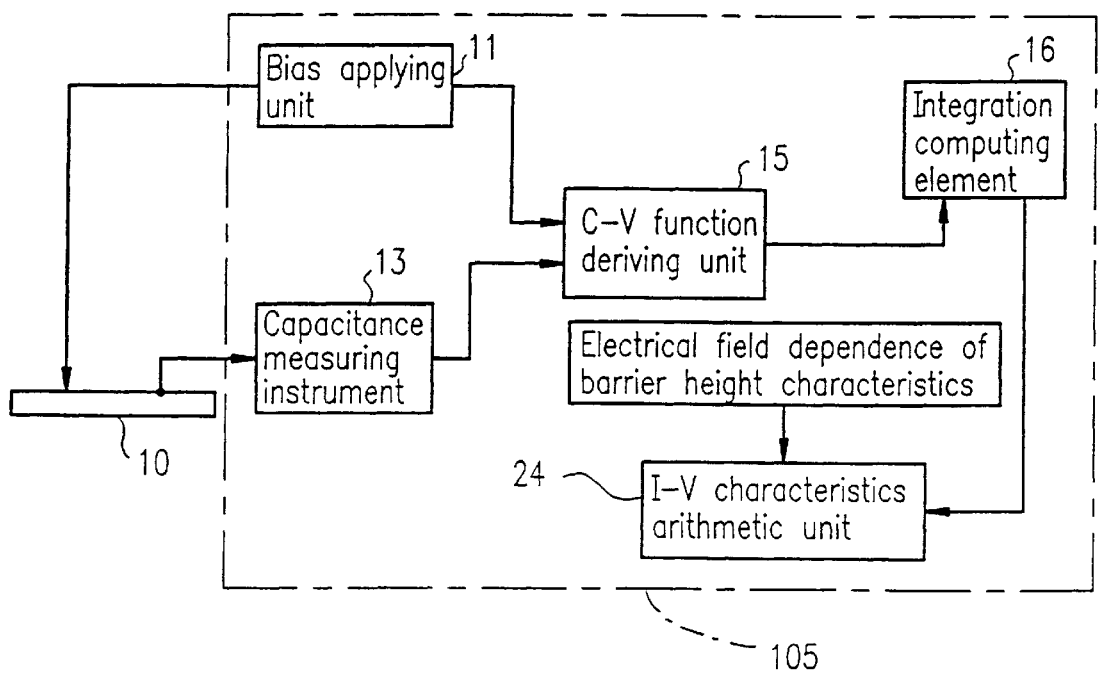
FIG. 16B is a block diagram showing a structure of a Schottky junction analyzing apparatus.

FIG. 16A is a flow chart showing processes in a method for analyzing a Schottky junction of Embodiment 5 according to the present invention. FIG. 16B is a block diagram showing a structure of a Schottky junction analyzing apparatus.

In a Schottky junction analyzing apparatus 105 of Embodiment 5, the current measuring instrument 12 and the I-V function deriving unit 14 in Embodiment 1 are omitted, and an I-V characteristics arithmetic unit 24 is provided in place of the dependence extracting arithmetic unit 17. Unlike Embodiment 1, assuming that the electrical field dependence of Schottky barrier height characteristics has already been determined, the depletion layer charge-voltage characteristics of the Schottky junction are obtained by measurement and operation. Based on the depletion layer charge-voltage characteristics and the electrical field dependence of Schottky barrier height characteristics, I-V characteristics of the Schottky junction are obtained.

Next, a method for analyzing a Schottky junction will be described.

First, in the same way as in Embodiment 1, the C-V function is obtained as the C-V characteristics (see FIG. 2) (Process P3). The C-V characteristics are integrated with respect to a voltage to obtain the depletion layer charge-voltage characteristics (Process P4).

Then, the I-V characteristics of the Schottky junction are obtained from the depletion layer charge-voltage characteristics and the known electrical field dependence of Schottky barrier height characteristics (Process P11) by the arithmetic unit 23 (Process P13).

More specifically, Expression (10) which represents the electrical field dependence of Schottky barrier height characteristics shows the I-V characteristics and the C-V characteristics of the Schottky junction. Therefore, in the arithmetic unit 24, when the C-V characteristics are derived by measurement and operation, and the I-V characteristics can be obtained only by operation.

Figure 17:
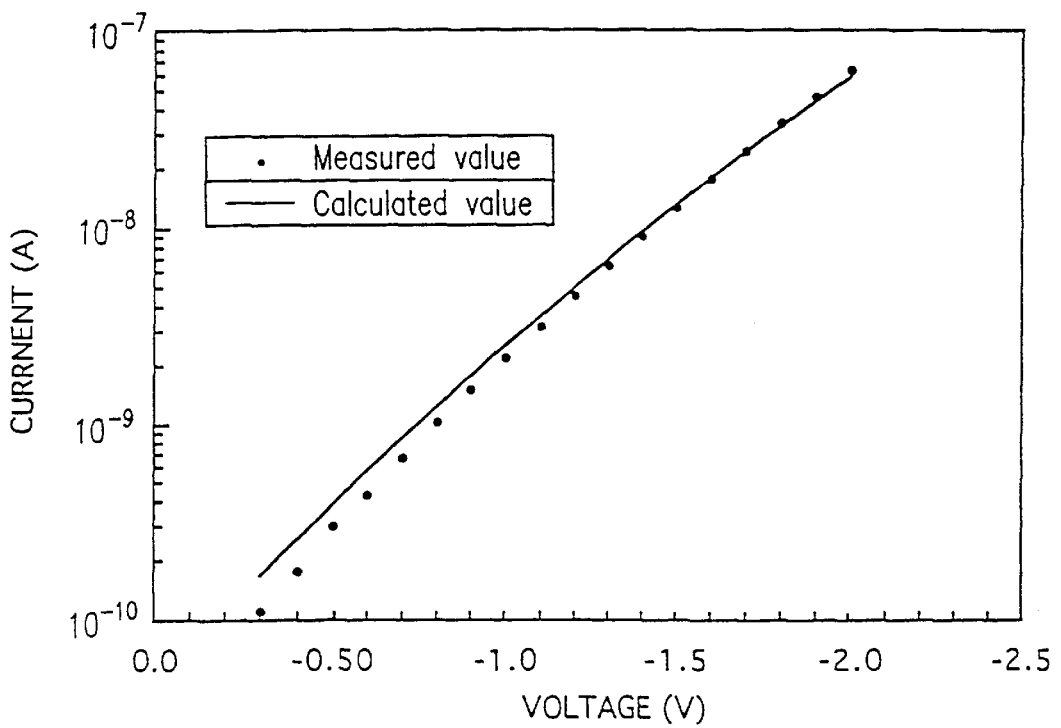
FIG. 17 is a graph showing I-V characteristics of a GaAs Schottky junction obtained by the method for analyzing a Schottky junction of Embodiment 5 according to the present invention and actually measured I-V characteristics of a GaAs Schottky junction.

A graph shown in FIG. 17 represents the I-V characteristics (calculated value) of a GaAs Schottky junction obtained by the method of Embodiment 5, and the actually measured I-V characteristics (measured value) of the GaAs Schottky junction. As is apparent from this graph, the calculated value is in agreement with the actually measured value.

The methods of Embodiments 4 and 5 are effective for separating an intrinsic component from a parasitic component with respect to a capacitance and a current of a semiconductor device and for constructing an equivalent circuit model of a semiconductor device.

According to the method for analyzing a Schottky junction of the present invention, in the case where the thickness of a depletion layer formed in a Schottky contact layer is sufficiently smaller than the size of a Schottky electrode, i.e., a capacitance of parallel plate is formed at an interface of a Schottky junction, Expressions (5), (6), (7), and (8) hold. Therefore, the method of the present invention is applicable to any Schottky junction.

In each Embodiment, the case where the crystallinity of a semiconductor wafer is evaluated utilizing the dependence of the proportionality factor $\alpha$ of Expression (3) on the crystallinity of a semiconductor region (more specifically, a Schottky contact layer) has been described. As is disclosed in Reference (4), in the case where an insulating film is present between a Schottky electrode and a semiconductor region, the proportionality factor $\alpha$ is proportional to the thickness of the insulating film, and the proportionality factor $\alpha$ increases with the increase in thickness of the insulating film. Therefore, the semiconductor permittivity of the insulating film which represents the performance of the insulating film can be evaluated by measuring the proportionality factor $\alpha$.

Such evaluation of the insulating film can be conducted as follows: for example, the semiconductor wafer 10 to be analyzed in Embodiment 1 is constructed so as to have a structure in which a Schottky electrode is provided on a Schottky contact layer with an insulating film formed therebetween; and the Schottky junction between the Schottky electrode and the Schottky contact layer is analyzed in the same way as in Embodiment 1.

As described above, according to the present invention, the Schottky junction can be analyzed even in a semiconductor wafer having a complicated semiconductor layer structure without requiring the extraction of parameter values such as the built-in voltage $V_{bi}$ and the donor impurity density $N_d$. Thus, the electrical field dependence of the Schottky barrier height, which had been difficult to measure, can be easily and precisely measured. As a result, a semiconductor wafer, an insulating film on a semiconductor wafer, a semiconductor device having a Schottky junction, etc. can be easily and precisely evaluated for characteristics by analyzing a Schottky junction.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for analyzing a Schottky Junction having a Schottky barrier height including the step of obtaining electrical field dependence of the Schottky barrier height,
    wherein the electrical field dependence of the Schottky barrier height is obtained based on capacitance-voltage characteristics and conductance-voltage characteristics of the Schottky Junction when a reverse bias is loading on the Schottky Junction, and
    wherein the conductance-voltage characteristics are measured directly or calculated from current-voltage characteristics of the Schottky Junction.

2. A method for analyzing a Schottky Junction according to claim 1, comprising the steps of:
    obtaining the current-voltage characteristics by measuring a plurality of current values of a current flowing through the Schottky Junction when a reverse bias is loading on the Schottky Junction; and
    calculating the conductance-voltage characteristics of the Schottky Junction by differentiating the current-voltage characteristics with respect to a voltage.

3. A method for analyzing a Schottky Junction according to claim 1, comprising the step of obtaining the capacitance-voltage characteristics of the Schottky Junction by measuring a plurality of capacitance values of the Schottky Junction when a reverse bias is loading on the Schottky Junction.

4. A method for analyzing a Schottky Junction according to claim 1, comprising the step of obtaining the conductance-voltage characteristics of the Schottky Junction by measuring a plurality of conductance values of the Schottky Junction when a reverse bias is loading on the Schottky Junction.

* * * * *

UNITED STATES PATENT AND TRADEMARK OFFICE
CERTIFICATE OF CORRECTION

PATENT NO.      : 6,239,608 B1
DATED           : May 29, 2001
INVENTOR(S)     : Yu Zhu, Yoshiteru Ishimaru, and Masafumi Shimizu It is certified that error appears in the above-identified patent and that said Letters Patent is hereby corrected as shown below:

<u>Title page,</u>
Foreign Application Priority Data section, please change "9-036773" to
-- 9-036770 --

Signed and Sealed this

Twenty-sixth Day of February, 2002

*Attest:*

JAMES E. ROGAN
*Attesting Officer*    *Director of the United States Patent and Trademark Office*